United States Patent
Uchaykin

(10) Patent No.: US 8,315,678 B2
(45) Date of Patent: Nov. 20, 2012

(54) SYSTEMS, METHODS, AND APPARATUS FOR MULTILAYER SUPERCONDUCTING PRINTED CIRCUIT BOARDS

(75) Inventor: Sergey V. Uchaykin, Burnaby (CA)

(73) Assignee: D-Wave Systems Inc., Burnaby (CA)

( * ) Notice: Subject to any disclaimer, the term of this patent is extended or adjusted under 35 U.S.C. 154(b) by 1055 days.

(21) Appl. No.: 12/247,475

(22) Filed: Oct. 8, 2008

(65) Prior Publication Data

US 2009/0099025 A1 Apr. 16, 2009

Related U.S. Application Data

(60) Provisional application No. 60/979,031, filed on Oct. 10, 2007.

(51) Int. Cl.
*H01L 39/24* (2006.01)
*H05K 1/00* (2006.01)
*H05K 3/00* (2006.01)

(52) U.S. Cl. ........ 505/220; 505/410; 505/470; 505/706; 427/63; 174/250; 174/261; 174/262; 428/209; 428/426; 428/432; 438/623; 257/661; 257/700

(58) Field of Classification Search .................. 505/170, 505/191, 201, 220, 330, 410, 413, 470, 701, 505/706, 862; 174/250, 261, 262; 29/829; 428/210, 426, 432, 688, 698, 701, 901, 930, 428/209, 411.1
See application file for complete search history.

(56) References Cited

U.S. PATENT DOCUMENTS

| | | | | |
|---|---|---|---|---|
| 4,316,200 A * | 2/1982 | Ames et al. | ...................... | 257/32 |
| 4,954,480 A * | 9/1990 | Imanaka et al. | .............. | 505/220 |
| 5,013,526 A * | 5/1991 | Kobayashi et al. | ............ | 420/430 |
| 5,081,070 A * | 1/1992 | Yokoyama et al. | ............ | 505/220 |
| 5,504,138 A | 4/1996 | Jacobs | ........................ | 524/496 |
| 6,184,477 B1 * | 2/2001 | Tanahashi | ..................... | 174/261 |
| 2004/0266209 A1* | 12/2004 | Hinode et al. | ................ | 438/737 |
| 2008/0176751 A1 | 7/2008 | Tcaciuc et al. | ................ | 505/210 |

FOREIGN PATENT DOCUMENTS

| | | |
|---|---|---|
| EP | 0487240 | 5/1992 |
| JP | 64000789 | 1/1989 |

OTHER PUBLICATIONS

Pobell, Matter and Methods at Low Temperatures, Springer-Verlag, Second Edition, 120-156, 1996.
U.S. Appl. No. 12/016,709, filed Jan. 18, 2008, Tcaciuc et al.
U.S. Appl. No. 12/016,801, filed Jan. 18, 2008, Thom et al.
U.S. Appl. No. 60/881,358, filed Jan. 18, 2007, Thom et al.

* cited by examiner

*Primary Examiner* — Stanley Silverman
*Assistant Examiner* — Kallambella Vijayakumar
(74) *Attorney, Agent, or Firm* — Seed IP Law Group PLLC

(57) ABSTRACT

Superconducting connections are provided to internal layers of a multi-layer circuit board structure, for example by superconducting vias.

20 Claims, 3 Drawing Sheets

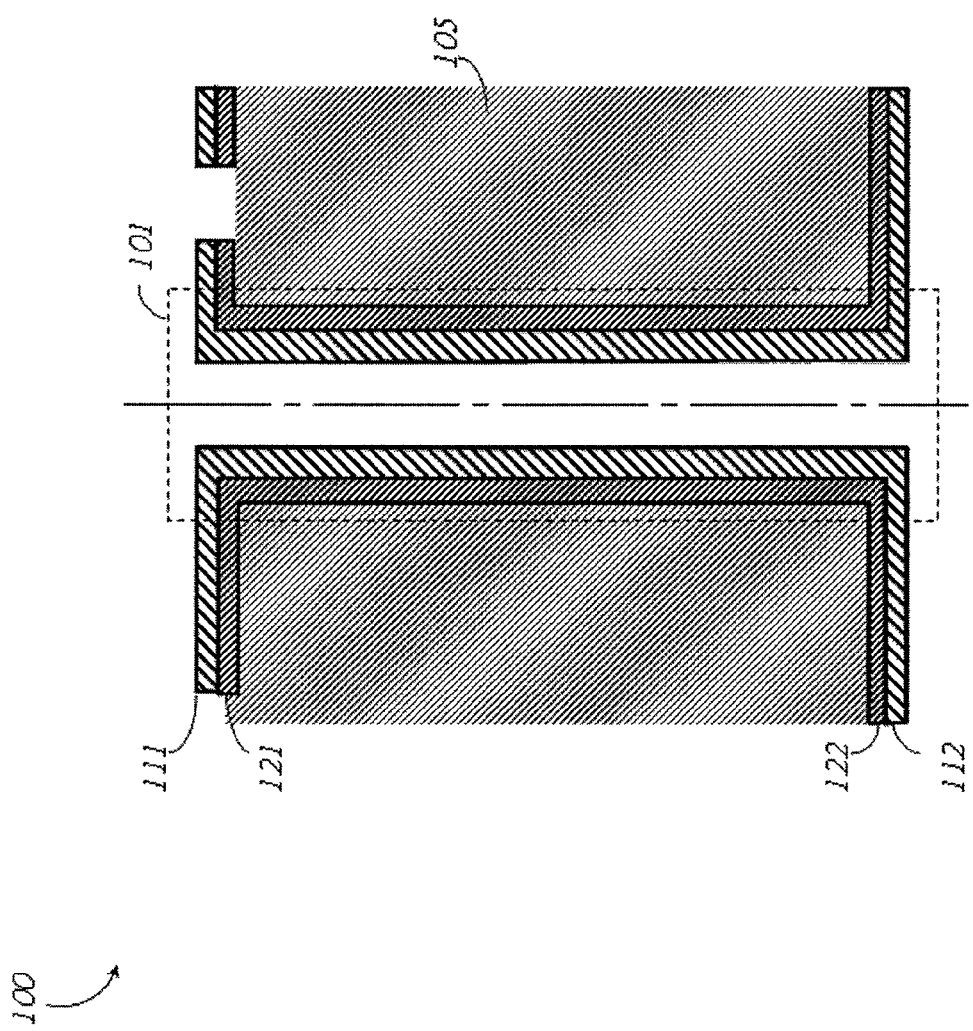

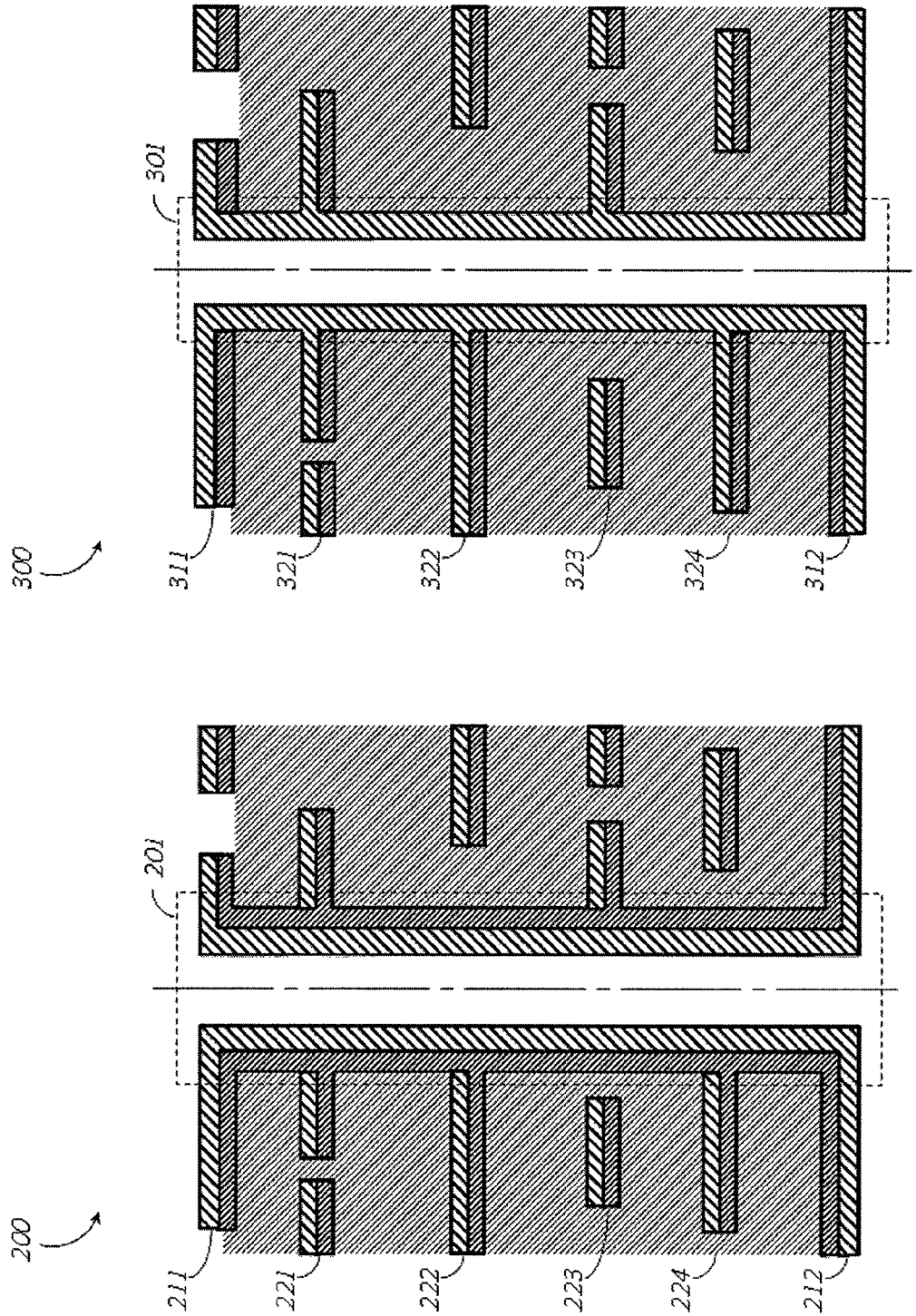
FIGURE 3
PRIOR ART
FIGURE 2

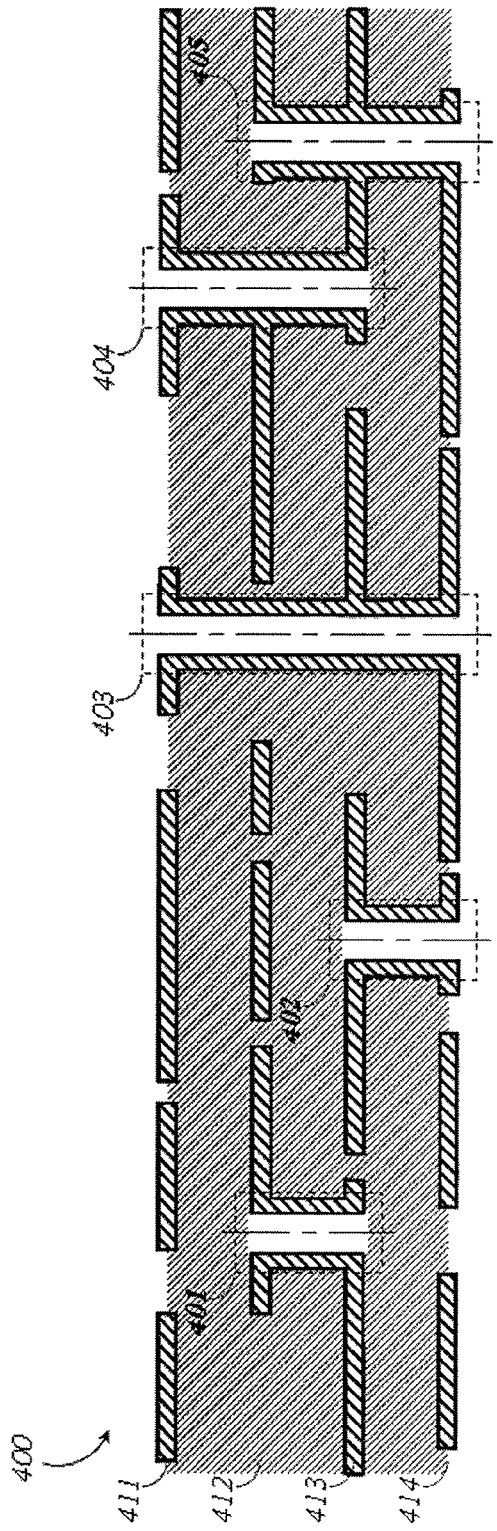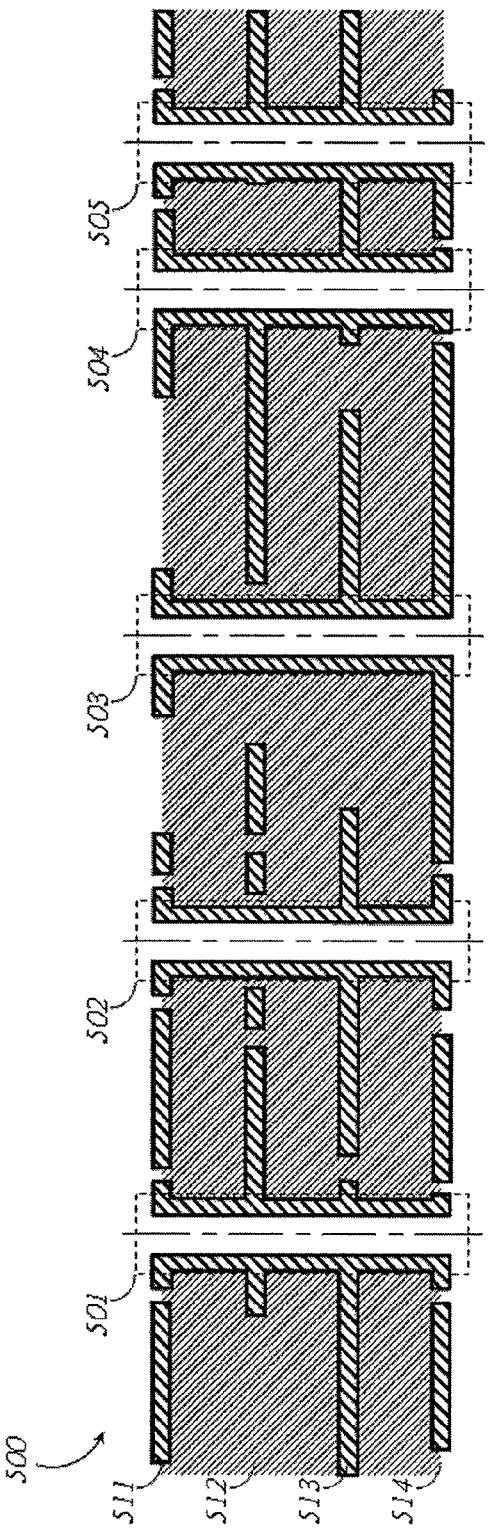
FIGURE 4
FIGURE 5

SYSTEMS, METHODS, AND APPARATUS FOR MULTILAYER SUPERCONDUCTING PRINTED CIRCUIT BOARDS

CROSS REFERENCE TO RELATED APPLICATIONS

This application claims benefit under 35 U.S.C. 119(e) of U.S. Provisional Patent Application Ser. No. 60/979,031, filed Oct. 10, 2007, entitled "Systems, Methods and Apparatus for Multilayer Superconducting Printed Circuit Boards", which is incorporated herein by reference in its entirety.

BACKGROUND

1. Field

The present systems, methods, and apparatus generally relate to the realization of superconducting circuits on multilayer superconducting printed circuit boards.

2. Description of the Related Art

Since they were first introduced around the time of World War II, conventional printed circuit boards ("PCBs") have simultaneously reduced in size and grown in sophistication. An important step in this evolution was the introduction of conductive vias to provide electrical communication between separate layers of a PCB. In non-superconducting applications, multilayer PCBs (i.e., PCBs with two or more layers of conductive traces) have been used for decades. However, a number of challenges that are inherent in non-superconducting electronics (e.g., power consumption and heat dissipation) continue to influence each stage of development of these devices and, ultimately, may limit the capabilities of non-superconducting PCB technology.

Superconducting technology can offer many advantages over conventional, non-superconducting electronics. Superconductors operate in a regime of little to no electrical resistance, and therefore do not generate heat to the same extent as conventional non-superconducting devices. Furthermore, superconducting devices are capable of achieving very high operational speeds. Many of the challenges that continue to plague conventional non-superconducting electronics technology may be overcome or circumvented by a conversion to superconducting technology. However, the sophistication of superconducting circuits to date has been limited to simple single- or double-layer PCBs.

BRIEF SUMMARY

At least one embodiment may be summarized as a superconducting printed circuit board including a first electrically insulative substrate layer having a first surface and a second surface opposed to the first surface; at least a second electrically insulative substrate layer having a first surface and a second surface opposed to the first surface, the second electrically insulative substrate layer physically coupled to the first electrically insulative substrate layer; a first superconducting current path positioned on a first surface side of the first electrically insulative substrate layer; a second superconducting current path positioned between the first and the second electrically insulative substrate layers; and a third superconducting current path that extends through the first electrically insulative substrate layer and superconductingly couples the first superconducting current path with the second superconducting current path.

The first superconducting current path may be carried on the first surface of the first insulative substrate layer. The first surface of the first insulative substrate layer may be a first outer surface physically accessible from an exterior of the superconducting printed circuit board. The second superconducting current path may be carried on the second surface of the first insulative substrate layer. The second superconducting current path may be carried on the first surface of the second insulative substrate layer and the first surface of the second insulative substrate layer may be successively adjacent the second surface of the first insulative substrate layer. The superconducting printed circuit board may further include a fourth superconducting current path positioned to be on a second surface side of the second electrically insulative substrate layer; and a fifth superconducting current path that extends through the second electrically insulative substrate layer and superconductingly couples the fourth superconducting current path with at least one of the first and the second superconducting current paths. The first surface of the first insulative substrate layer may be a first outer surface physically accessible from an exterior of the superconducting printed circuit board and the second surface of the second electrically insulative substrate layer may be a second outer surface physically accessible from the exterior of the superconducting printed circuit board. The superconducting printed circuit board may further include at least a third electrically insulative substrate layer having a first surface and a second surface opposed to the first surface, the third electrically insulative substrate layer physically coupled to the second electrically insulative substrate layer; at least one additional superconducting current path carried by the second surface of the third electrically insulative substrate layer; and a sixth superconducting current path that extends through the third electrically insulative substrate layer and superconductingly couples at least the one additional superconducting current path with at least one of the first, the second, and the fourth superconducting current paths. The second electrically insulative substrate layer may be sandwiched between the first and the third electrically insulative substrate layers. At least one of the first and the second superconducting current paths may be a superconducting trace. The superconducting trace may include a non-superconducting trace plated with a superconducting material. The first electrically insulative substrate layer may have at least a first hole that extends from the first surface to the second surface and the third superconducting current path that superconductingly couples the first superconducting current path with the second superconducting current path is formed at least in part by a superconducting material plated on at least a portion of an inner surface of the first hole. The first electrically insulative substrate layer may have at least a first hole that extends from the first surface to the second surface, and the superconducting printed circuit board may further include a sparse layer of binder material plated on at least a portion of an inner surface of the first hole, wherein the third superconducting current path that superconductingly couples the first superconducting current path with the second superconducting current path is formed at least in part by a superconducting material plated on at least a portion of the binder material. The binder material may include palladium. The first electrically insulative substrate layer may have at least a first hole that extends from the first surface to the second surface and the third superconducting current path that superconductingly couples the first superconducting current path with the second superconducting current path is formed by a distinct piece of metal. The distinct piece of metal may be secured in place by a solder connection. At least one of the first, the second and the third superconducting current paths may include tin and/or niobium.

At least one embodiment may be summarized as a method of fabricating a superconducting via in a multilayer superconducting printed circuit board including forming a hole through at least a portion of the printed circuit board; and providing a superconducting material in at least a portion of the hole such that at least one superconducting connection is made between the superconducting material and a superconducting trace on an inner layer of the multilayer printed circuit board.

Providing a superconducting material in at least a portion of the hole may include plating at least a portion of a surface of the hole with the superconducting material. Providing a superconducting material in at least a portion of the hole may include plating at least a portion of a surface of the hole with a binding material and plating at least a portion of the binding material with the superconducting material, wherein the binding material binds the superconducting material to the at least a portion of the surface of the hole. The binding material may include palladium. The superconducting material may include tin and/or niobium. Forming a hole through at least a portion of the printed circuit board may include drilling the hole.

BRIEF DESCRIPTION OF THE SEVERAL VIEWS OF THE DRAWING(S)

In the drawings, identical reference numbers identify similar elements or acts. The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn are not intended to convey any information regarding the actual shape of the particular elements, and have been solely selected for ease of recognition in the drawings.

FIG. 1 is a cross-sectional view of a portion of a bi-layer superconducting printed circuit board with a superconductor-plated through-hole.

FIG. 2 is a cross-sectional view of a portion of a multilayer superconducting printed circuit board with a superconductor-plated through-hole.

FIG. 3 is a cross-sectional view of a portion of a multilayer superconducting printed circuit board that provides inter-layer superconducting communication through a superconducting via, according to one illustrated embodiment of the present disclosure.

FIG. 4 is a cross sectional view of an embodiment of a multilayer superconducting printed circuit board that includes five superconducting vias for communicating superconductingly between various layers, according to another illustrated embodiment of the present disclosure.

FIG. 5 is a cross sectional view of another embodiment of a multilayer superconducting printed circuit board that includes five superconducting vias for communicating superconductingly between various layers, according to yet a further illustrated embodiment of the present disclosure.

DETAILED DESCRIPTION

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with printed circuit boards, superconducting circuits, devices and control systems including microprocessors and drive circuitry have not been shown or described in detail to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense, that is as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

The headings and Abstract of the Disclosure provided herein are for convenience only and do not interpret the scope or meaning of the embodiments.

The present systems, methods and apparatus describe multilayer superconducting printed circuit boards ("PCBs") that include superconducting communication between at least two of the layers through at least one superconducting via, where at least one of the layers is an inner layer, not physically accessible from an exterior of the substrate structure except by a via, through-hole or other opening. Accordingly, the present systems, methods and apparatus describe multilayer superconducting PCBs that benefit from inter-layer superconducting communication paths. Such devices represent an important advancement in the field of superconductivity as they facilitate the development of more sophisticated superconducting circuits.

Throughout this specification and the appended claims, the terms "insulative material", "insulative medium" and "insulative substrate" are used interchangeably to describe an electrically insulative substrate which electrically insulates conductive or superconductive current paths from one another. The electrically insulative material may, for example, take the form of FR-2, a synthetic resin-bonded paper or FR-4, a fiberglass-type material. The electrically insulative material may be provided as a substrate layer having opposed surfaces which may serve as a physical structure surface upon which the conducting and/or superconducting paths of the circuit may be carried. The superconductive paths may be plated (e.g., by hot air solder leveling) or otherwise deposited, printed or formed using various techniques.

In a multilayer PCB, multiple substrate layers of electrically insulative material may be sandwiched together to physically separate and electrically insulate various levels of current paths from one another. This may be accomplished by plating or otherwise depositing, printing or forming conductive current paths on the top and/or bottom surfaces or faces of at least two substrate wafers, and then sandwiching the two wafers together, with a third wafer therebetween that separates the two inner layers of conductive current paths. For this reason, there is generally an even number of conductive layers in a multilayer PCB. Alternatively, the substrate structure may be built up "insulative substrate layer by insulative substrate layer", sequentially depositing electrically insulative material, conductive material and/or superconductive material to form the various layers. Drilling, etching or other techniques may be used to form one or more vias extending all or partially through one or more of the substrate layers.

Conductive current paths are commonly known as "traces" and are typically made of a conductive metal, such as copper. In some designs, the surfaces of the insulating material or substrate layers may first be coated with a sparse layer of binding material, such as palladium or graphite, which allows the conductive traces to physically bind to the insulating medium. Copper metal is typically used for the conductive traces. Throughout the remainder of this specification, the term "normal non-superconducting metal" is used to describe a conductive material, path or trace that is not superconducting at typical superconducting temperatures. Those of skill in the art will appreciate that the term "normal non-superconducting metal" may include pure elemental metals as well as metallic alloys. Also, throughout this specification and the appended claims, the term "superconducting" when used to describe a physical structure such as a "superconducting current path" is used to indicate a material that behaves as a superconductor when operated at an appropriate temperature. A superconducting material may not necessarily be acting as a superconductor at all times in all embodiments of the present systems, methods and apparatus.

A superconducting PCB may be fabricated by laying out the conductive traces of the circuit with normal non-superconducting metal, such as copper, and then plating or otherwise depositing or forming a superconducting metal (e.g., tin or lead) on the normal non-superconducting metal. The conductive traces may be deposited or otherwise formed on at least one surface or face of an insulative medium. A sparse layer of a binding material, such as palladium or graphite, may be included to help bind the conductive traces to the insulative medium. Multiple conductive layers may be separated by respective layers of the same insulative medium. To date there appears to have been no means known for establishing superconducting communication between the multiple layers. The assignee has previously disclosed a technique for establishing superconducting communication between the two outer-layers of a superconducting PCB using a superconductor-plated through-hole. This technique involves forming (e.g., drilling) a hole through the PCB, coating the hole with a binding agent such as palladium or graphite, plating the hole with a normal non-superconducting metal, and then plating the normal non-superconducting metal with a superconducting metal.

FIG. 1 is a cross-sectional view of a portion of a bi-layer superconducting PCB 100 with a superconductor-plated through-hole 101. PCB 100 includes an insulative medium 105 and two outer superconducting layers 111 and 112 each being plated on a respective non-superconducting layer (121 and 122, respectively). The sparse layer of binding material, such as palladium, is not visible in FIG. 1. In such superconducting PCBs, each superconducting trace is plated upon a non-superconducting trace and through-hole 101 provides a superconducting communication path between the top and bottom superconducting traces on PCB 100 (layers 111 and 112, respectively). Applications of such superconductor-plated through-holes are described in U.S. patent application Ser. Nos. 12/016,801 and 12/016,709 and in U.S. provisional patent application Ser. No. 60/881,358 filed Jan. 18, 2007.

A property of the structure of FIG. 1 is that such a structure only provides superconducting connections between the two outer surfaces of a PCB. Superconductor-plated through-hole 101 cannot establish a superconducting communication path with an inner layer in a multilayer superconducting PCB.

FIG. 2 is a cross-sectional view of a portion of a multilayer superconducting PCB 200 with a superconductor-plated through-hole 201. Multilayer superconducting PCB 200 includes two outer superconducting layers 211 and 212 (top and bottom, respectively) and four inner superconducting layers 221-224. Through-hole 201 is formed (e.g., drilled) right through PCB 200 and, according to common practice, plated with a non-superconducting metal such as, for example, copper, before being plated with a superconducting metal such as, for example, tin or lead, or an alloy such as, for example, tin-lead. In some embodiments, a layer of palladium or graphite (not shown) may be used to bind the copper to the insulative medium. This technique may provide superconducting communication between outer layers 211 and 212, however the inner layers 221-224 are electrically insulated from such superconducting inter-communication. This is because copper, while a good conductor at room temperature, has effectively an infinitely higher resistance than tin when the system is cooled to the superconducting regime. In FIG. 2, a layer of non-superconducting metal such as copper separates the superconducting inner layers from the superconductor-plating on through-hole 201. Thus, the superconductor-plated through-hole technique that is used in the prior attempts does not provide superconducting communication with the inner layers in a multilayer PCB, and it is at least partly because of this that multilayer superconducting PCBs have not been used to date.

The present systems, methods and apparatus describe multilayer superconducting PCBs that include superconducting communication between at least one inner superconducting layer and another superconducting layer in the PCB. This inter-layer superconducting communication may be accomplished through superconducting vias.

FIG. 3 is a cross-sectional view of a portion of a multilayer superconducting PCB 300 that provides inter-layer superconducting communication through a superconducting via 301. Multilayer superconducting PCB 300 includes two outer superconducting layers 311 and 312 (top and bottom, respectively) and three inner superconducting layers 321-324. Superconducting via 301 extends through PCB 300, however those of skill in the art will appreciate that superconducting via 300 may extend only part way through PCB 300 depending on the layout of the superconducting traces in PCB 300. Via 301 may be formed in a variety of ways, for example mechanical drilling, laser drilling, etching, etc. As an alternative technique for fabricating a superconducting trace (as opposed to plating a non-superconducting metal with a superconducting metal), in some embodiments a superconducting trace may be laid directly upon a surface of the insulative medium. For instance, the conductive traces of a superconducting circuit may be laid out with a superconducting metal, such as niobium, directly upon a surface of the insulative medium. Some such embodiments may also include a layer of binding material, such as palladium or graphite, to help bind the superconducting metal to the insulative medium.

For illustrative purposes, PCB 300 uses the same layout of superconducting traces as PCB 200. However superconducting via 301 differs from superconductor-plated through-hole 201 in that superconducting via 301 is not plated with a non-superconducting metal, such as copper. In some embodiments, the walls of superconducting via 301 are plated only with superconducting metal which is not plated onto the surface of a non-superconducting metal. A sparse layer of binding material, such as palladium (not shown), may be used to bind the superconducting metal to the insulative medium. The removal of the non-superconducting plating, for instance the copper plating, allows superconducting connections to be formed between the walls of superconducting via 301 and the inner superconducting layers 321-324, and thereby allows the fabrication of multilayer superconducting PCBs of much higher sophistication than previously seen in the art. In embodiments that include a sparse layer of binding material, such as palladium, the sparse layer of palladium may not interfere with superconducting connections between the via and inner layers of the PCB. For direct comparison, PCB 200 in FIG. 2 has established superconducting communication between outer layers 211 and 212, with inner layers 221-224 being insulated from such superconducting communication. Conversely, PCB 300 in FIG. 3 has established superconducting communication between portions of all layers. Those of skill in the art will appreciate that both the layout of superconducting layers 311, 312, and 321-324 shown in FIG. 3 and the number of superconducting layers used are meant to serve only as examples. The present systems, methods and apparatus may be applied to any multilayer superconducting PCB configuration.

Those of skill in the art will appreciate that a given multilayer superconducting PCB may use any number of superconducting vias to communicate superconductingly between layers.

FIG. 4 is a cross sectional view of an embodiment of a multilayer superconducting PCB 400 that includes five superconducting vias 401-405 for communicating superconductingly between the four layers 411-414. For simplification, the layers of non-superconducting metal (e.g., the copper) that may be included underneath the superconducting traces are not shown in FIG. 4, nor are any sparse layers of binding material, such as palladium, that may be included. Those of skill in the art will appreciate that, in some embodiments, the superconducting traces may be plated upon non-superconducting metal which itself may be affixed to the insulative medium using a sparse layer of binding material, such as palladium.

Each of the five superconducting vias 401-405 provides a superconducting communication path between a different combination of layers 411-414. For example, via 401 superconductingly connects superconducting traces in layers 412 and 413; via 402 superconductingly connects superconducting traces in layers 413 and 414; via 403 superconductingly connects superconducting traces in layers 411, 413, and 414; via 404 superconductingly connects superconducting traces in layers 411, 412 and 413; and via 405 superconductingly connects superconducting traces in layers 412, 413 and 414. Those of skill in the art will appreciate that a superconducting via may similarly be used to superconductingly connect superconducting traces or paths from any number of layers and in any combination. In FIG. 4, each of the superconducting vias 401-405 extends to a different depth in PCB 400. For example, via 403 extends right through PCB 400, while via 404 extends only far enough to reach layer 413. Furthermore, superconducting via 401 is completely contained within PCB 400 and is not visible from the surface. Vias 402, 404, and 405 are "blind" superconducting vias because they are only visible from one side of PCB 400, while via 401 is a "buried" superconducting via because it is not visible from either surface of PCB 400. In some embodiments, it may be more practical to form (e.g., drill) all superconducting vias to extend right through PCB 400 in order reduce costs and to simplify the fabrication process. In such embodiments, the layouts of the superconducting traces on each layer of a multilayer superconducting PCB may be arranged to accommodate holes or gaps in each layer as required.

FIG. 5 is a cross sectional view of another embodiment of a multilayer superconducting PCB 500 that includes five superconducting vias 501-505 for communicating superconductingly between the four layers 511-514. For comparison, PCB 500 is laid out in a similar way to PCB 400, except that all of the superconducting vias 501-505 in PCB 500 extend through PCB 500. The same specific layer connections are made as in PCB 400, and the superconducting traces in PCB 500 are simply arranged to go around vias 501-505 as required. For example, via 501 superconductingly connects superconducting traces in layers 512 and 513; via 502 superconductingly connects superconducting traces in layers 512 and 514; via 503 superconductingly connects superconducting traces in layers 511, 513, and 514; via 504 superconductingly connects superconducting traces in layers 511, 512 and 513; and via 505 superconductingly connects superconducting traces in layers 512, 513 and 514.

In some embodiments of the present systems, methods and apparatus, it may be advantageous to secure a distinct plug or core of material inside a superconducting via. In some applications, the superconducting metal that plates the inner surface of a superconducting via, such as via 301, may fragment or detach from the inner surface of the via. The likelihood of this fragmentation may be reduced by inserting a distinct plug or core inside the superconducting via. For example, a piece of wire, such as copper wire, may be inserted inside a superconducting via, such as via 301. This wire may be secured in place, for example, by a solder connection and/or by bending the ends of the wire that may protrude from the superconducting via. Placing such a wire in a superconducting via may help to protect the surface of the superconducting via and hold the superconducting plating in place.

According to the present state of the art, a superconducting material may generally only act as a superconductor if it is cooled below a critical temperature that is characteristic of the specific material in question. For this reason, those of skill in the art will appreciate that a system that implements superconducting devices may implicitly include a system for cooling the superconducting materials in the system. Systems and methods for such cooling are well known in the art. A dilution refrigerator is an example of a system that is commonly implemented for cooling a superconducting material to a temperature at which the superconducting material may act as a superconductor. In common practice, the cooling process in a dilution refrigerator may use a mixture of at least two isotopes of helium (such as helium-3 and helium-4). Full details on the operation of typical dilution refrigerators may be found in F. Pobell, *Matter and Methods at Low Temperatures*, Springer-Verlag Second Edition, 1996, pp. 120-156. However, those of skill in the art will appreciate that the present systems, methods and apparatus are not limited to applications involving dilution refrigerators, but rather may be applied using any type of cooling system.

The above description of illustrated embodiments, including what is described in the Abstract, is not intended to be exhaustive or to limit the embodiments to the precise forms disclosed. Although specific embodiments of and examples are described herein for illustrative purposes, various equivalent modifications can be made without departing from the spirit and scope of the disclosure, as will be recognized by those skilled in the relevant art. The teachings provided herein of the various embodiments can be applied to multilayer superconducting PCB systems, methods and apparatus, not necessarily the exemplary multilayer superconducting PCB systems, methods, and apparatus generally described above.

The various embodiments described above can be combined to provide further embodiments. All of the U.S. patents, U.S. patent application publications, U.S. patent applications, foreign patents, foreign patent applications and nonpatent publications referred to in this specification and/or listed in the Application Data Sheet, including but not limited to U.S. Provisional Patent Application Ser. No. 60/979,031, filed Oct. 10, 2007, entitled "Systems, Methods and Apparatus for Multilayer Superconducting Printed Circuit Boards", U.S. patent application Ser. No. 12/016,801, U.S. patent application Ser. No. 12/016,709, and U.S. Provisional Patent Application Ser. No. 60/881,358, filed Jan. 18, 2007, entitled "Input/Output Systems and Devices for Use with Superconducting Based Computing Systems" are incorporated herein by reference, in their entirety. Aspects of the embodiments can be modified, if necessary, to employ systems, circuits and concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A multilayer superconducting printed circuit board, comprising:
a first electrically insulative substrate layer having a first surface and a second surface opposed to the first surface, wherein the first electrically insulative substrate layer has at least a first hole that extends from the first surface to the second surface and wherein at least a portion of an inner surface of the first hole is coated with a binder material;
at least a second electrically insulative substrate layer having a first surface and a second surface opposed to the first surface, the second electrically insulative substrate layer physically coupled to the first electrically insulative substrate layer;
a first superconducting current path consisting of an elemental or alloyed superconducting metal positioned on a first surface side of the first electrically insulative substrate layer;
a second superconducting current path consisting of an elemental or alloyed superconducting metal positioned between the first and the second electrically insulative substrate layers; and
a third superconducting current path that extends through the first hole in the first electrically insulative substrate layer and superconductingly couples the first superconducting current path with the second superconducting current path, wherein the third superconducting current path consists of an elemental or alloyed superconducting metal plated on at least a portion of the binder material on the inner surface of the first hole.

2. The superconducting printed circuit board of claim 1 wherein the first superconducting current path is carried on the first surface of the first insulative substrate layer.

3. The superconducting printed circuit board of claim 2 wherein the first surface of the first insulative substrate layer is a first outer surface physically accessible from an exterior of the superconducting printed circuit board.

4. The superconducting printed circuit board of claim 3 wherein the second superconducting current path is carried on the second surface of the first insulative substrate layer.

5. The superconducting printed circuit board of claim 3 wherein the second superconducting current path is carried on the first surface of the second insulative substrate layer and the first surface of the second insulative substrate layer is successively adjacent the second surface of the first insulative substrate layer.

6. The superconducting printed circuit board of claim 1, further comprising:
a fourth superconducting current path positioned to be on a second surface side of the second electrically insulative substrate layer; and
a fifth superconducting current path that extends through the second electrically insulative substrate layer and superconductingly couples the fourth superconducting current path with at least one of the first and the second superconducting current paths.

7. The superconducting printed circuit board of claim 6 wherein the first surface of the first insulative substrate layer is a first outer surface physically accessible from an exterior of the superconducting printed circuit board and the second surface of the second electrically insulative substrate layer is a second outer surface physically accessible from the exterior of the superconducting printed circuit board.

8. The superconducting printed circuit board of claim 6, further comprising:
at least a third electrically insulative substrate layer having a first surface and a second surface opposed to the first surface, the third electrically insulative substrate layer physically coupled to the second electrically insulative substrate layer;
at least one additional superconducting current path carried by the second surface of the third electrically insulative substrate layer; and
a sixth superconducting current path that extends through the third electrically insulative substrate layer and superconductingly couples at least the one additional superconducting current path with at least one of the first, the second, and the fourth superconducting current paths.

9. The superconducting printed circuit board of claim 8 wherein the second electrically insulative substrate layer is sandwiched between the first and the third electrically insulative substrate layers.

10. The superconducting printed circuit board of claim 1 wherein at least one of the first superconducting current path and the second current path is plated on a non-superconducting trace.

11. The superconducting printed circuit board of claim 1 wherein the binder material comprises palladium.

12. The superconducting printed circuit board of claim 1, further comprising a distinct plug inside the first hole.

13. The superconducting printed circuit board of claim 12 wherein the distinct plug includes a piece of wire secured in place by a solder connection.

14. The superconducting printed circuit board of claim 1 wherein at least one of the first, the second and the third superconducting current paths comprises tin.

15. The superconducting printed circuit board of claim 1 wherein at least one of the first, the second and the third superconducting current path comprises niobium.

16. A method of fabricating a superconducting via in a multilayer superconducting printed circuit board comprising a first electrically insulative substrate layer having a first surface and a second surface opposed to the first surface; at least a second electrically insulative substrate layer having a first surface and a second surface opposed to the first surface, the second electrically insulative substrate layer physically coupled to the first electrically insulative substrate layer; a first superconducting current path consisting of an elemental or alloyed superconducting metal positioned on a first surface side of the first electrically insulative substrate layer; and a second superconducting current path consisting of an elemental or alloyed superconducting metal positioned between the first and the second electrically insulative substrate layers; the method comprising:

forming a hole through at least a portion of the first electrically insulative substrate layer;

coating at least a portion of an inner surface of the hole with a binding material; and plating at least a portion of the inner surface of the hole with an elemental or alloyed superconducting metal, wherein the binding material binds the superconducting metal to at least a portion of the inner surface of the hole such that a third superconducting current path extends through the hole and superconductingly couples the first superconducting current path with the second superconducting current path.

17. The method of claim 16 wherein the binding material comprises palladium.

18. The method of claim 16 wherein the superconducting metal comprises tin.

19. The method of claim 16 wherein the superconducting metal comprises niobium.

20. The method of claim 16 wherein forming a hole through at least a portion of the first electrically insulative substrate layer includes drilling the hole.

* * * * *